(12) United States Patent
Tschanz et al.

(10) Patent No.: US 7,400,186 B2
(45) Date of Patent: Jul. 15, 2008

(54) BIDIRECTIONAL BODY BIAS REGULATION

(75) Inventors: James W. Tschanz, Portland, OR (US); Victor Zia, Beaverton, OR (US); Vivek K. De, Beaverton, OR (US); Joseph Shor, Tel Mond (IL)

(73) Assignee: Intel Corporation, Santa Clara, CA (US)

( * ) Notice: Subject to any disclaimer, the term of this patent is extended or adjusted under 35 U.S.C. 154(b) by 207 days.

(21) Appl. No.: 11/324,628

(22) Filed: Jan. 3, 2006

(65) Prior Publication Data
US 2007/0164808 A1 Jul. 19, 2007

(51) Int. Cl.
*G05F 1/10* (2006.01)
(52) U.S. Cl. .................................. 327/534
(58) Field of Classification Search .......... 327/530, 327/534, 535, 538, 543
See application file for complete search history.

(56) References Cited

U.S. PATENT DOCUMENTS 6,784,722 B2   8/2004   Tang et al.
6,917,237 B1 *  7/2005  Tschanz et al. ............. 327/513
7,138,851 B2 * 11/2006  Sumita et al. ............... 327/534

OTHER PUBLICATIONS

Tschanz, James W., "Adaptive Body Bias for Reducing Impacts of Die-to-Die and Within-Die Parameter Variations on Microprocessor Frequency and Leakage", IEEE Journal of Solid-State Circuits, vol. 37, No. 11, Nov. 2002, pp. 1396-1402.
"ISSCC 2002 / Session 16 / High Speed I/O / 16.4", 3pgs.

* cited by examiner

Primary Examiner—Jeffrey S Zweizig
(74) Attorney, Agent, or Firm—Buckley, Maschoff & Talwalkar LLC

(57) ABSTRACT

A system may include detection of a direction of transistor body current flow, and control of a regulator transistor to regulate a transistor body voltage based on the detected direction. In some aspects, a first regulator transistor is controlled if the direction of current flow is into a transistor body and a second regulator transistor is controlled if the direction of current flow is out of the transistor body.

14 Claims, 8 Drawing Sheets

BIDIRECTIONAL BODY BIAS REGULATION

BACKGROUND

Body bias refers to the application of a non-zero voltage between the body and source terminals of a transistor. Since these terminals form a p-n junction, a voltage that forward biases the p-n junction is said to apply a forward body bias to the transistor. Similarly, a reverse body bias may be applied to the transistor by reverse biasing the p-n junction. Generally, body bias may be used to modulate the threshold voltage of a transistor to provide increased performance or reduced power consumption. A forward body bias may be used to increase an operational frequency of a transistor during an active mode, while a reverse (or zero) body bias may be used to reduce leakage currents during a standby mode.

Body bias may be controlled by controlling a bias voltage that is applied to a transistor body. A body bias generator typically regulates this bias voltage. A conventional body bias generator is suitable for regulating the bias voltage in a case that current flows in a single direction (i.e., in or out) with respect to the transistor body. Since a direction of current within a transistor body may differ based on whether a forward or reverse (or zero) body bias is applied to the transistor, a conventional body bias generator may be unsuitable for systems in which forward body bias or reverse body bias may be selectively applied.

DETAILED DESCRIPTION

Figure 1:
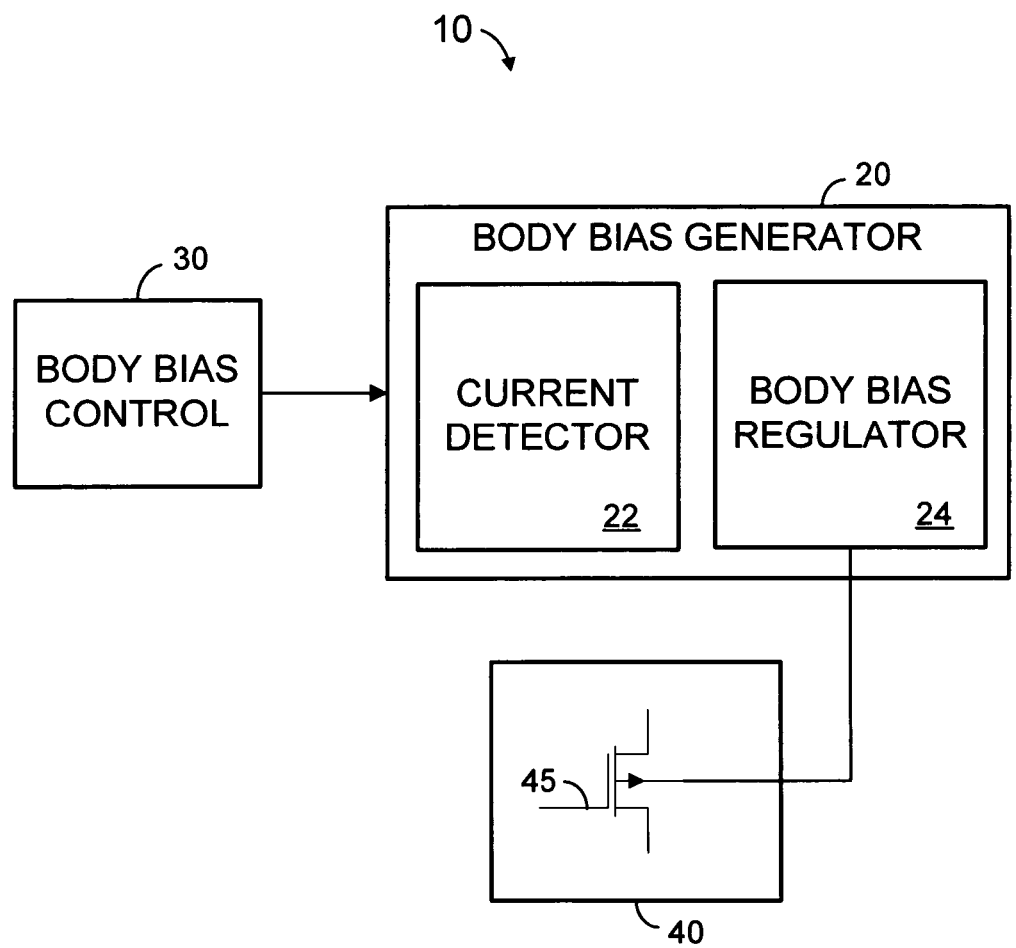
FIG. 1 is a block diagram of a system according to some embodiments.

FIG. 1 is a block diagram of a system according to some embodiments. System 10 may be used to regulate a body bias voltage despite bidirectional body current. System 10 includes body bias generator 20, body bias control 30 and integrated circuit 40.

Body bias generator 20 may detect a direction of transistor body current flow according to some embodiments. Body bias generator 20 may also control a regulator transistor to regulate a transistor body voltage based on the detected direction. The regulated transistor body voltage may be applied to a body of transistor 45 of integrated circuit 40.

Body bias generator 20 includes current detector 22 and body bias regulator 24. Current detector 22 may be used to detect the direction of transistor body current flow as described above, and body bias regulator 24 may control a regulator transistor to regulate a transistor body voltage based on the detected direction. Specific implementations of detector 22 and regulator 24 will be described below with respect to FIGS. 4, 7 and 8.

Body bias control 30 may determine a body bias voltage to be output by body bias generator 20. The voltage may be determined using any currently- or hereafter-known technique. According to some embodiments, the body bias voltage is determined based on an operating mode (e.g., active or standby) of integrated circuit 40, a supply voltage of integrated circuit 40, a temperature, and/or any other factors.

Integrated circuit 40 includes one or more integrated electrical devices, including p-channel transistor 45. Integrated circuit 40 may provide any functions that are or become known, and may be fabricated according to any suitable techniques. As described above, current detector 22 may detect the direction of transistor body current flow within transistor 45 and body bias regulator 24 may control a regulator transistor to regulate a body voltage of transistor 45 based on the detected direction. In some embodiments, one, some, or all elements of system 10 are integrated into an integrated circuit die and/or package in which integrated circuit 40 and transistor 45 are also integrated.

Figure 2A:
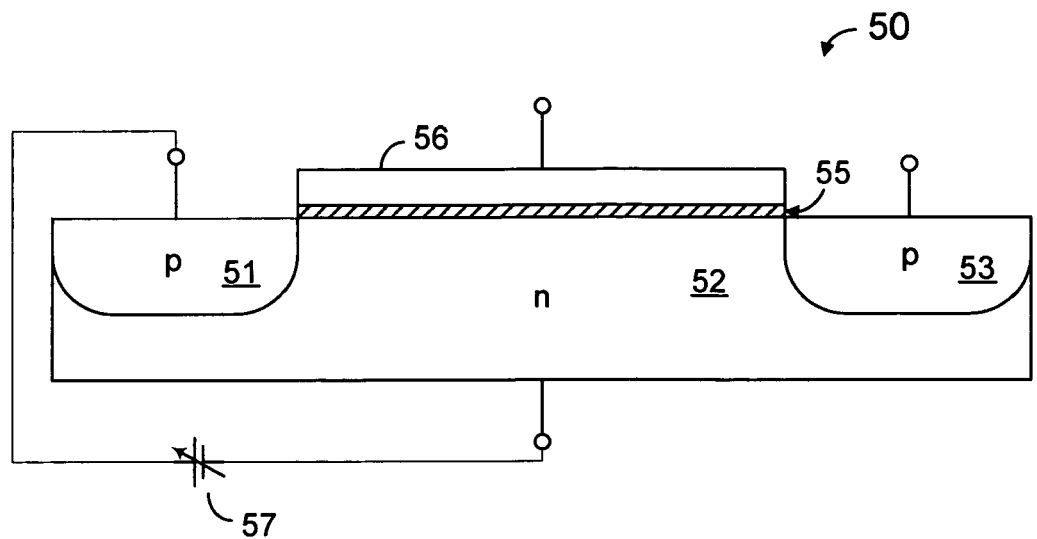
FIG. 2A is a diagram of a p-channel transistor illustrating a forward body bias according to some embodiments.
Figure 2B:
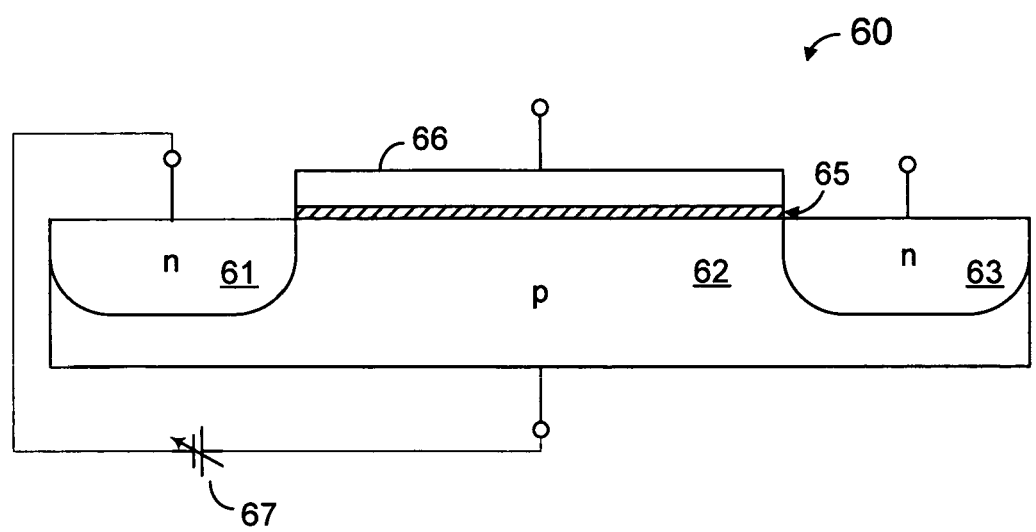
FIG. 2B is a diagram of an n-channel transistor illustrating a forward body bias according to some embodiments.

FIGS. 2A and 2B illustrate body biasing according to some embodiments. P-channel transistor 50 of FIG. 2A includes p-type source region 51, n-type body region 52 and p-type drain region 53. Oxide 55 is disposed over body region 52 and conductive element 56 overlays oxide 55.

Body bias regulator 24 of FIG. 1 may apply a body bias voltage to body region 52. The body bias voltage is represented in conjunction with a voltage applied to source region 51 as biasing source 57. Biasing source 57 may forward bias or reverse bias the p-n junction of source 51 and body 52 according to some embodiments.

FIG. 2B illustrates n-channel transistor 60 according to some embodiments. Transistor 60 includes n-type source region 61, p-type body region 62 and n-type drain region 63. Oxide 65 is disposed over body region 62 and conductive element 66 overlays oxide 65. Body bias regulator 24 may be used to apply a body bias voltage to body region 62. This body bias voltage is represented in tandem with whatever voltage is applied to source region 51 as biasing source 57.

Applying forward body bias to transistors 50 or 60 may lower a magnitude of their respective threshold (i.e. "turn on") voltages. For example, a threshold voltage $V_{TH}$ of transistor 50 may equal −1.1V when a first forward body bias is applied thereto, but −1.0V when the forward body bias is increased. Increasing the forward body bias may increase switching speeds of transistors 50 or 60, but may also increase leakage power.

On the other hand, applying reverse body bias to transistors 50 or 60 may increase the threshold voltages thereof. Such an increase may reduce leakage power, and therefore may be beneficial during a standby mode. In the case of transistor 60, forward body bias causes current to flow in a direction into body region 62 and reverse (or zero) body bias causes current to flow in a direction out of body region 62.

Figure 3:
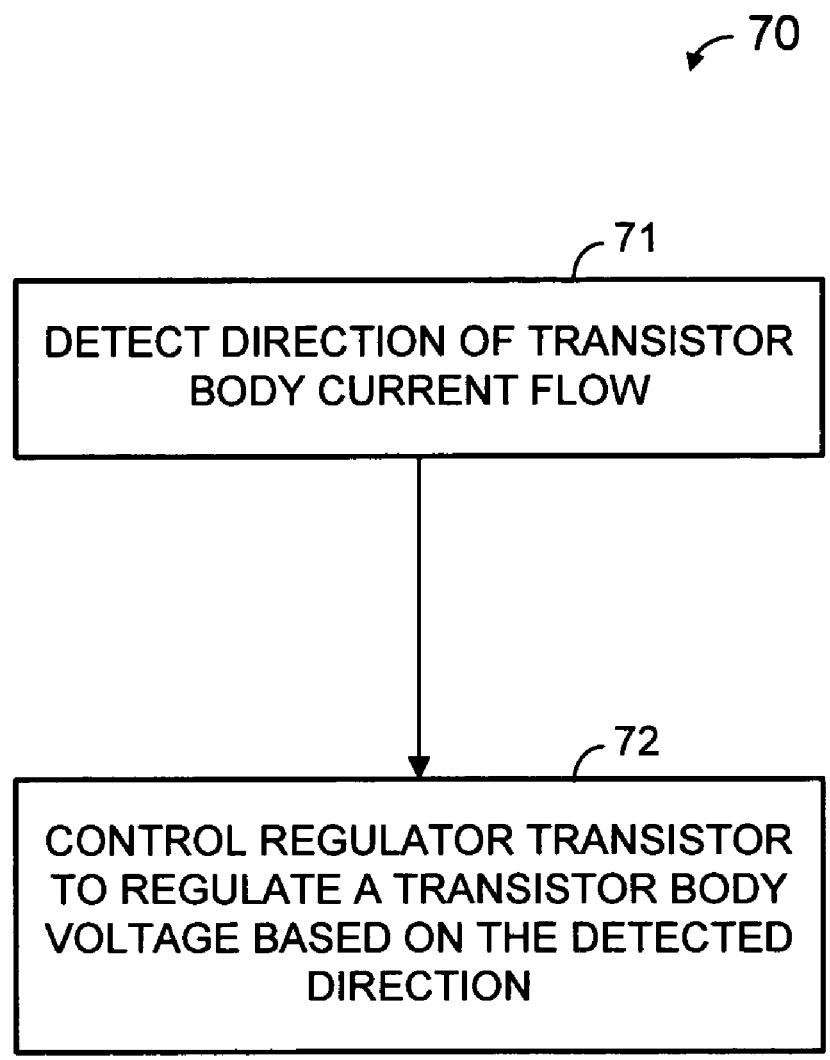
FIG. 3 is a diagram of a process according to some embodiments.

FIG. 3 is a diagram of a general process according to some embodiments. Process 70 may be executed by any combination of hardware and software elements, some of which may be located remote from one another. Some or all of process 70 may be executed manually. According to some embodiments, process 70 is performed by body bias generator 20 of FIG. 1.

At 71, a direction of transistor body current flow is detected. The direction may be detected by any suitable system that is or becomes known. In some embodiments, current detector 22 of body bias generator 20 detects whether current is flowing into or out of the body of transistor 45.

A regulator transistor is controlled to regulate a transistor body voltage based on the detected direction at 72. Body bias regulator 24 controls a regulator transistor to regulate a body voltage applied to transistor 45 according to some embodiments of 72. Body bias regulator 24 controls the regulator transistor based on the detected direction, examples of which will be provided below. Process 70 may therefore provide regulation of transistor body bias irrespective of a direction of body current flow.

Figure 4:
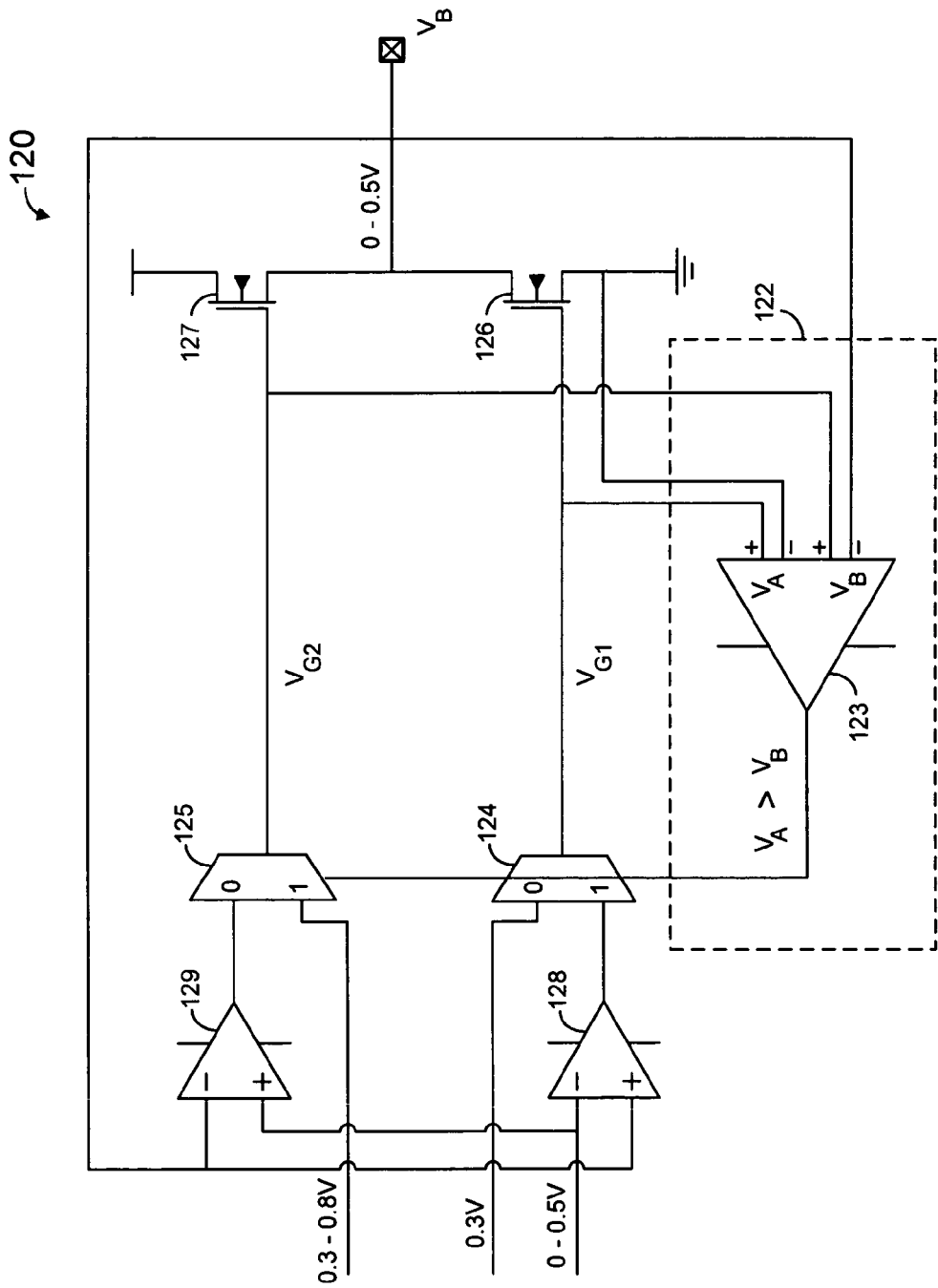
FIG. 4 is a schematic diagram of an apparatus according to some embodiments.

FIG. 4 is a schematic diagram of apparatus 120 according to some embodiments. Apparatus 120 may operate to detect a direction of transistor body current flow and to control a regulator transistor to regulate transistor body voltage $V_B$ based on the detected direction.

Apparatus 120 includes current detector 122. The remaining illustrated elements of apparatus 120 may be considered elements of a body bias regulator such as regulator 24 of FIG. 1. Detector 122 includes comparator 123, and may detect a direction of transistor body current flow according to some embodiments.

Apparatus 120 also includes selector 124, selector 125, n-channel regulator transistor 126 and n-channel regulator transistor 127, op-amp 128 and op-amp 129. According to some embodiments, op-amp 128 controls transistor 126 if the detected direction of current flow is out of the transistor body, and op-amp 129 controls transistor 127 if the detected direction of current flow is into the transistor body. The three input voltages to apparatus 120 may be provided by body bias control 30 of FIG. 1.

According to some embodiments, n-channel regulator transistor 126 and n-channel regulator transistor 127 are substituted with substantially identical p-channel regulator transistors. Voltage $V_B$ may be used for purposes other than application to a transistor body in some embodiments. Generally, apparatus 120 may be used in any system requiring a bidirectional regulator that senses current flow on its output node and regulates an appropriate transistor based thereon.

Figure 5:
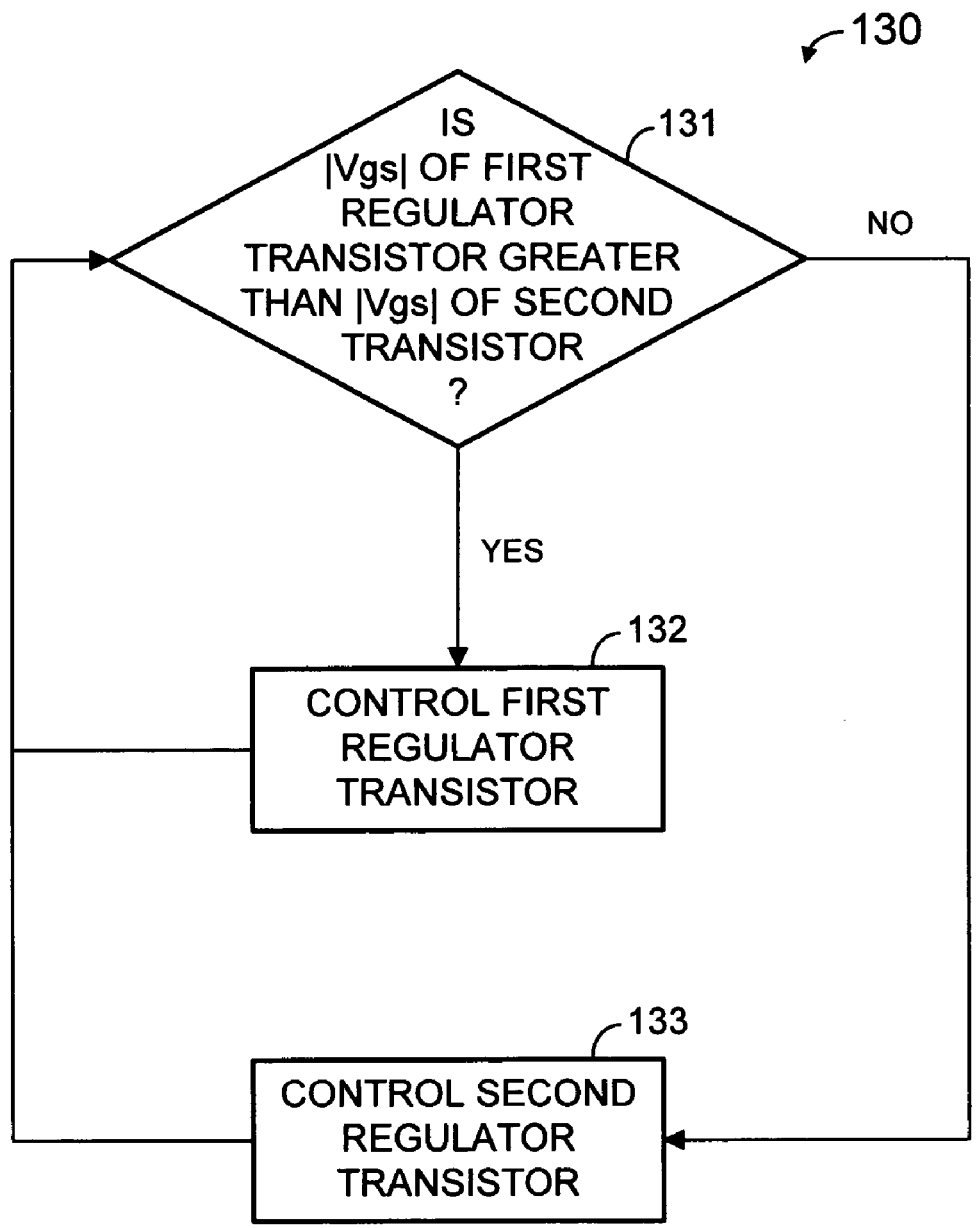
FIG. 5 is a diagram of a process according to some embodiments.

FIG. 5 is a diagram of process 130 executed by apparatus 120 according to some embodiments. Process 130 may be executed by any suitable combination of hardware and software elements.

Initially, at 131, it is determined whether a magnitude of a gate-to-source voltage of a first regulator transistor is greater than a magnitude of a gate-to-source voltage of a second regulator transistor. Comparator 123 is coupled to regulator transistor 126 and to regulator transistor 127 to compare a magnitude of a gate-to-source voltage of regulator transistor 126 ($V_A$) with a magnitude of a gate-to-source voltage of regulator transistor 127 ($V_B$). Comparator outputs a "1" if the determination at 131 is positive and a "0" otherwise.

According to some embodiments, the determination at 131 may also determine a direction of transistor body current flow. A source of regulator transistor 126 is connected to ground, a drain of regulator transistor 126 is connected to a transistor body, a source of regulator transistor 127 is connected to the transistor body, and a drain of regulator transistor 127 is connected to a positive supply voltage. Assuming that transistors 126 and 127 are of substantially identical sizes, current flow out of node $V_B$ will result in a gate-to-source voltage of regulator transistor 126 that is greater in magnitude than a gate-to-source voltage of regulator transistor 127. Similarly, current flow into node $V_B$ will result in a gate-to-source voltage of regulator transistor 126 that is smaller in magnitude than a gate-to-source voltage of regulator transistor 127.

The first regulator transistor is therefore controlled at 132 if the magnitude of the gate-to-source voltage of the first regulator transistor is greater than the magnitude of the gate-to-source voltage of the second regulator transistor. Continuing with the above example, the "1" output by comparator 123 causes selector 124 to transmit the output of op-amp 128 to a gate terminal of regulator transistor 126. One input of op-amp 128 is connected to a feedback signal ($V_B$). Accordingly, regulator transistor 126 is feedback-controlled to regulate $V_B$ based on the desired bias voltage (e.g. 0 to 0.5V). A substantially fixed voltage (0.3 to 0.8V, depending on the desired $V_B$) is applied to a gate terminal of regulator transistor 127 in the meantime.

Flow returns to 131 from 132. Flow proceeds to 133 from 131 if the magnitude of the gate-to-source voltage of the first regulator transistor is not determined to be greater than the magnitude of the gate-to-source voltage of the second regulator transistor at 131. As described above, this relationship between the gate-to-source voltages indicates a direction of current flow into the transistor body.

The second regulator transistor is controlled at 133 because the direction of current flow is into the transistor body. For example, the resulting "0" output by comparator 123 causes selector 124 to apply a substantially fixed voltage (0.3V) to the gate terminal of regulator transistor 126, and causes selector 125 to transmit the output of op-amp 129 to a gate terminal of regulator transistor 127. Since one input of op-amp 129 is connected to $V_B$ via a feedback loop, regulator transistor 127 is feedback-controlled to regulate $V_B$ to its desired voltage. Flow then returns to 131 and continues as described above.

Figure 6:
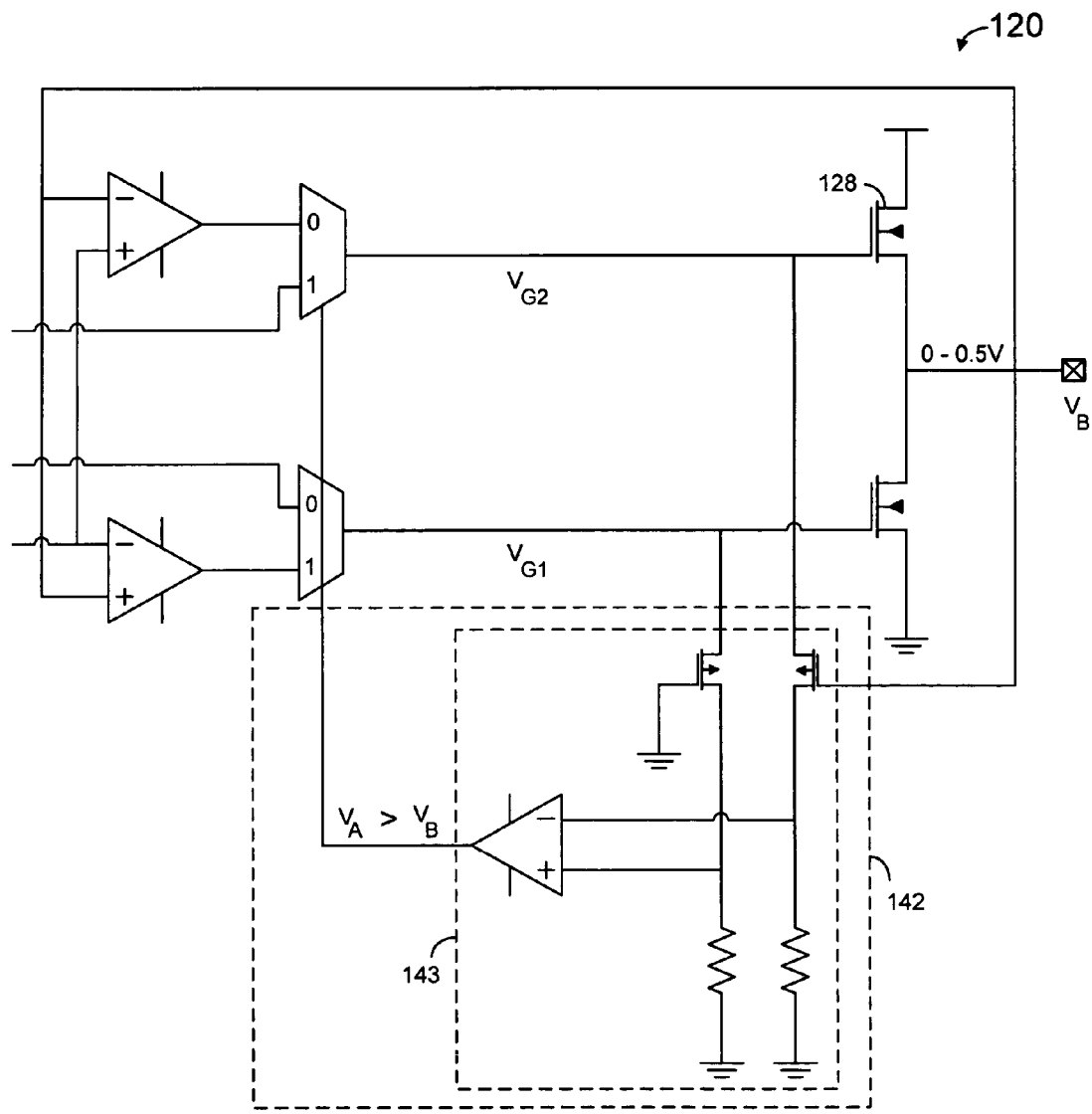
FIG. 6 is a schematic diagram of an apparatus according to some embodiments.

FIG. 6 is a schematic diagram of apparatus 140 according to some embodiments. Apparatus 140 includes current detector 142, which in turn includes comparator 143. Comparator 143 may comprise an implementation of comparator 123 of apparatus 120. Accordingly, apparatus 140 of FIG. 6 may operate as described above with respect to apparatus 120 of FIG. 4.

Figure 7:
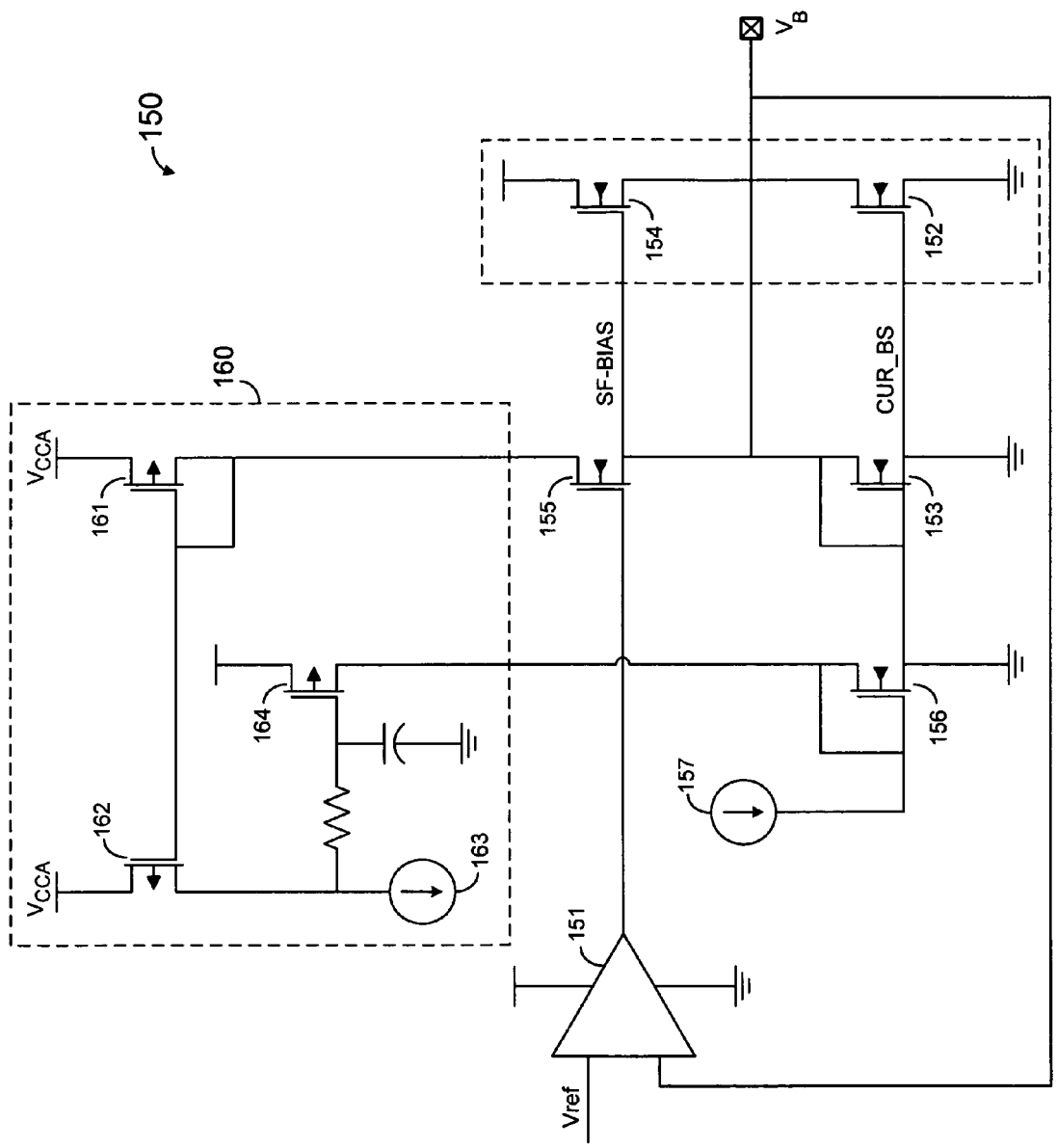
FIG. 7 is a schematic diagram of an apparatus according to some embodiments.

FIG. 7 is a schematic diagram of apparatus 150 according to some embodiments. Apparatus 150 may operate to detect a direction of transistor body current flow and to control a regulator transistor to regulate a transistor body voltage based on the detected direction.

According to some embodiments, apparatus 150 detects the direction of transistor body current flow by comparing current in a first regulator transistor to a reference current, and by comparing current in a second regulator transistor to the reference current. If the direction of current flow is into a transistor body, current in a first current mirror is increased and the increased current is mirrored to a first regulator transistor. If the direction of current flow is out of the transistor body, current in a second current mirror is increased and the increased current is mirrored to a second regulator transistor.

More particularly, apparatus 150 includes two-stage Miller amplifier 151 for receiving a trimmable reference voltage ($V_{ref}$). In operation, apparatus 150 regulates body voltage $V_B$ to $V_{ref}$. Apparatus 150 may receive $V_{ref}$ from body bias control 30 of FIG. 1. $V_{ref}$ is between 0.2V and 0.55V at 50 mV increments according to some embodiments.

A drain of regulator transistor 152 is connected to a transistor body, a gate of regulator transistor 152 is connected to a gate of current mirror transistor 153, and a source of regulator transistor 152 is connected to ground. A source of regulator transistor 154 is coupled to a drain of regulator transistor 152, a drain of regulator transistor 154 is connected to a positive supply voltage, a gate of regulator transistor 154 is connected to a gate of current mirror transistor 155, and a source of regulator transistor 154 is connected to the transistor body.

Regulator transistors 152 and 154 may be duplicated any number of times throughout a target system such as integrated circuit 40. According to some embodiments, transistors 152 and 154 (and corresponding ones of transistors 153 and 155) have widths of 40 µm and 80 µm, respectively. Each instance of transistors 152 and 154 receives CUR_BS and SF_BIAS signals, respectively, at its gate terminal.

In operation, transistor 156 and current source 157 provide a DC bias to regulator transistor 152. Miller amplifier 151 regulates the SF_BIAS signal to $V_B+V_t$ (the threshold voltage of transistor 154). Transistors 153 and 155, which use $V_{CCA}$ (e.g., 1.5V) as a supply, regulate the current in regulator transistor 152. Transistors 161 and 162 of current detector 160 measure the current in transistor 155 and compare the measured current to a reference current of current source 163.

It is determined that the direction of current flow is into the transistor body if the measured current is smaller than the reference current. Accordingly, the p-channel transistor 164 increases the current in transistor 156. The increased current is mirrored to transistor 153 and is again mirrored to transistor 152.

The direction of current flow is out of the transistor body if the measured current is greater than the reference current. In such a case, the loop formed by transistors 153, 155, 156, 161, 162, and 164 forces the current in transistor 154 to be equal to the reference current. Apparatus 150 thereby provides efficient regulation of body bias voltage $V_B$ regardless of a direction of body current flow.

Figure 8:
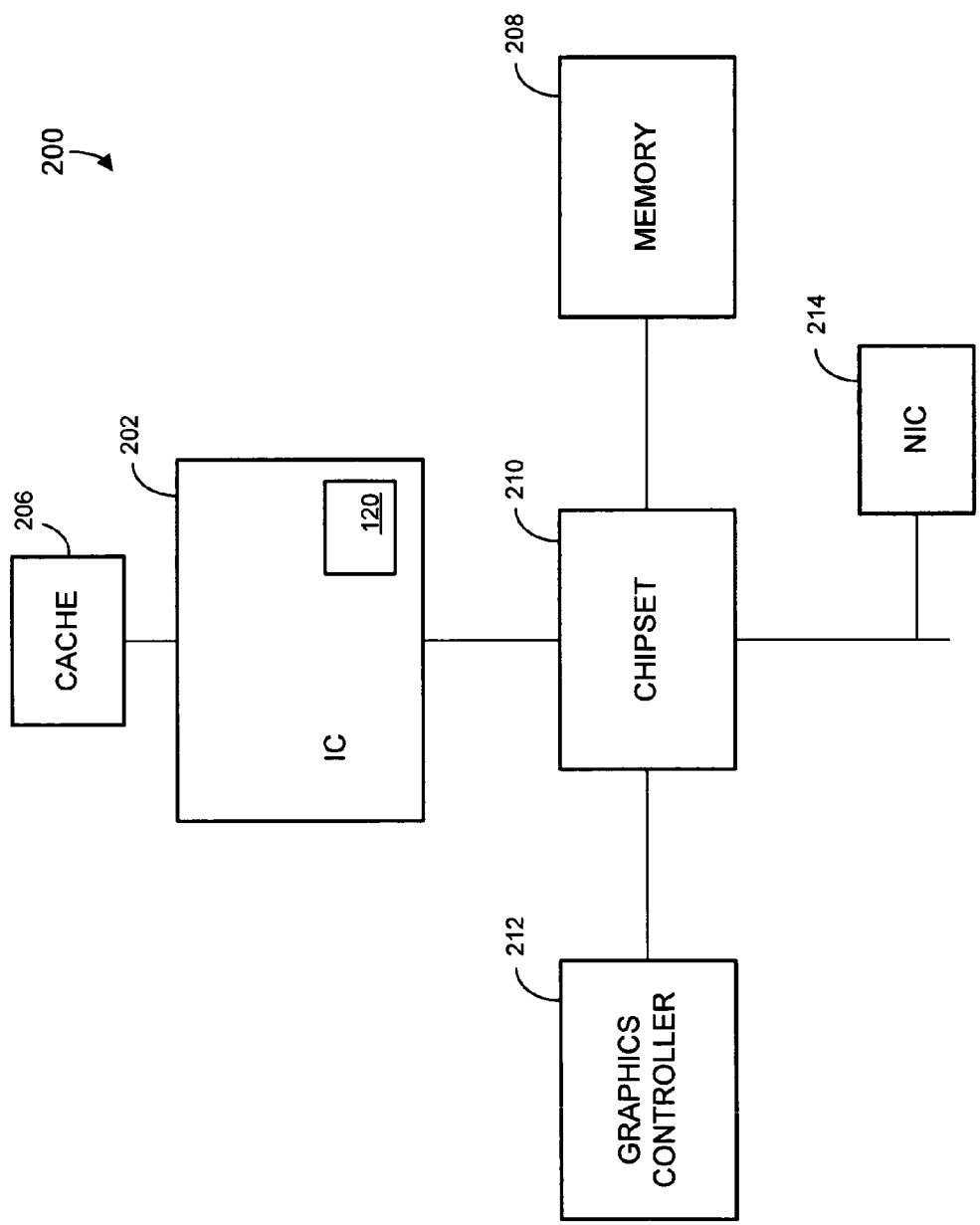
FIG. 8 is a block diagram of a system according to some embodiments.

FIG. 8 illustrates a block diagram of system 200 according to some embodiments. System 200 includes integrated circuit 202 comprising apparatus 120 of FIG. 4. According to some embodiments, apparatus 120 detects a direction of transistor body current flow within integrated circuit 202 and controls a regulator transistor to regulate a transistor body voltage within integrated circuit 202 based on the detected direction.

Integrated circuit 202 may be a microprocessor or another type of integrated circuit. Integrated circuit 202 communicates with off-die cache 206 according to some embodiments. Integrated circuit 202 may communicate with system memory 208 via a host bus and chipset 210. System memory 208 may comprise any type of memory for storing data, such as a Single Data Rate Random Access Memory, a Double Data Rate Random Access Memory, or a Programmable Read Only Memory. Other off-die functional units, such as graphics controller 212 and Network Interface Controller (NIC) 214, may communicate with integrated circuit 202 via appropriate busses or ports.

The several embodiments described herein are solely for the purpose of illustration. Some embodiments may include any currently or hereafter-known versions of the elements described herein. Therefore, persons in the art will recognize from this description that other embodiments may be practiced with various modifications and alterations.

What is claimed is:

1. A method comprising:
    detecting a direction of transistor body current flow, wherein detecting the direction of transistor body current flow comprises determining whether a magnitude of a gate-to-source voltage of a first regulator transistor is greater than a magnitude of a gate-to-source voltage of a second regulator transistor; and
    controlling the first or the second regulator transistor to regulate a transistor body voltage based on the detected direction.

2. A method according to claim 1, wherein controlling the first or the second regulator transistor comprises controlling the first regulator transistor if the direction of current flow is into a transistor body, and
wherein controlling the first or the second regulator transistor comprises controlling the second regulator transistor if the direction of current flow is out of the transistor body.

3. A method according to claim 1, wherein a drain of the second transistor is connected to a positive supply voltage, a source of the second transistor is connected to the transistor body, a drain of the first transistor is connected to the transistor body, and a source of the first transistor is connected to ground.

4. A method according to claim 1, further comprising:
    selecting a feedback-controlled gate voltage for the first regulator transistor and a substantially fixed gate voltage for the second regulator transistor if the magnitude of a gate-to-source voltage of the first regulator transistor is greater than the magnitude of the gate-to-source voltage of the second regulator transistor; and
    selecting a feedback-controlled gate voltage for the second regulator transistor and a substantially fixed gate voltage for the first regulator transistor if the magnitude of a gate-to-source voltage of the first regulator transistor is less than the magnitude of the gate-to-source voltage of the second regulator transistor.

5. A method according to claim 1, wherein controlling the first or the second regulator transistor comprises:
    if the direction of current flow is into a transistor body, increasing current in a first current mirror; and
    mirroring the increased current in the first current mirror to the first regulator transistor; and
    if the direction of current flow is out of the transistor body, increasing current in a second current mirror; and
    mirroring the increased current in the second current mirror to the second regulator transistor.

6. A method according to claim 5, wherein a drain of the second regulator transistor is connected to a positive supply voltage, a gate of the second regulator transistor is connected to a gate of the second current mirror, a source of the second regulator transistor is connected to the transistor body, a drain of the first regulator transistor is connected to the transistor body, a gate of the first regulator transistor is connected to a gate of the first current mirror, a source of the first regulator transistor is connected to ground and a source of the second regulator transistor is coupled to a drain of the first regulator transistor.

7. An apparatus comprising:
    a current detector to detect a direction of transistor body current flow; and
    a body bias regulator comprising a first regulator transistor and a second regulator transistor, the body bias regulator to control the first regulator transistor or the second regulator transistor to regulate a transistor body voltage based on the detected direction, wherein the current detector comprises:
    a comparator to determine whether a magnitude of a gate-to-source voltage of the first regulator transistor is greater than a magnitude of a gate-to-source voltage of the second regulator transistor;
    a first selector coupled to the comparator to select a feedback-controlled gate voltage for the first regulator transistor if the magnitude of a gate-to-source voltage of the first regulator transistor is greater than the magnitude of the gate-to-source voltage of the second regulator transistor, and to select a substantially fixed gate voltage for the first regulator transistor if the magnitude of a gate-to-source voltage of the first regulator transistor is less than the magnitude of the gate-to-source voltage of the second regulator transistor; and a second selector coupled to the comparator to select a substantially fixed gate voltage for the first regulator transistor if the magnitude of a gate-to-source voltage of the first regulator transistor is greater than the magnitude of the gate-to-source voltage of the second regulator transistor, and to select a feedback-controlled gate voltage for the second regulator transistor if the magnitude of a gate-to-source voltage of the first regulator transistor is less than the magnitude of the gate-to-source voltage of the second regulator transistor.

8. An apparatus according to claim 7, the body bias regulator to control the first regulator transistor if the direction of current flow is into a transistor body, and the body bias regulator to control the second regulator transistor if the direction of current flow is out of the transistor body.

9. An apparatus according to claim 7, wherein a drain of the second transistor is connected to a positive supply voltage, a source of the second transistor is connected to the transistor body, a drain of the first transistor is connected to the transistor body, and a source of the first transistor is connected to ground.

10. An apparatus according to claim 7, the body bias regulator comprising:

a first current mirror to increase current in the first regulator transistor if the direction of current flow is into a transistor body; and a second current mirror to increase current in the second regulator transistor if the direction of current flow is out of the transistor body.

11. An apparatus according to claim 10, the current detector to determine if the direction of current flow is into or out of the transistor body by comparing the current in the first regulator transistor to a reference current, and by comparing the current in the second regulator transistor to the reference current.

12. An apparatus according to claim 10, wherein a drain of the second regulator transistor is connected to a positive supply voltage, a gate of the second regulator transistor is connected to a gate of the second current mirror, a source of the second regulator transistor is connected to the transistor body, a drain of the first regulator transistor is connected to the transistor body, a gate of the first regulator transistor is connected to a gate of the first current mirror, a source of the first regulator transistor is connected to ground and a source of the second regulator transistor is coupled to a drain of the first regulator transistor.

13. A system comprising:

a microprocessor comprising:

a transistor comprising a transistor body;

a current detector to detect a direction of current flow within the transistor body; and a body bias regulator comprising a first regulator transistor and a second regulator transistor, the body bias regulator to control the first regulator transistor or the second regulator transistor to regulate a voltage of the transistor body based on the detected direction; and a double data rate memory coupled to the microprocessor, wherein the current detector comprises:

a comparator to determine whether a magnitude of a gate-to-source voltage of a first regulator transistor is greater than a magnitude of a gate-to-source voltage of a second regulator transistor;

a first selector coupled to the comparator to select a feedback-controlled gate voltage for the first regulator transistor if the magnitude of a gate-to-source voltage of the first regulator transistor is greater than the magnitude of the gate-to-source voltage of the second regulator transistor, and to select a substantially fixed gate voltage for the first regulator transistor if the magnitude of a gate-to-source voltage of the first regulator transistor is less than the magnitude of the gate-to-source voltage of the second regulator transistor; and a second selector coupled to the comparator to select a substantially fixed gate voltage for the first regulator transistor if the magnitude of a gate-to-source voltage of the first regulator transistor is greater than the magnitude of the gate-to-source voltage of the second regulator transistor, and to select a feedback-controlled gate voltage for the second regulator transistor if the magnitude of a gate-to-source voltage of the first regulator transistor is less than the magnitude of the gate-to-source voltage of the second regulator transistor.

14. A system according to claim 13, wherein a drain of the second transistor is connected to a positive supply voltage, a source of the second transistor is connected to the transistor body, a drain of the first transistor is connected to the transistor body, and a source of the first transistor is connected to ground.

* * * * *